United States Patent [19]
Teel, Jr.

[11] Patent Number: 5,428,294
[45] Date of Patent: Jun. 27, 1995

[54] REVERSE/FORWARD BIAS TESTER FOR RELAY AND DIODE PACKAGES

[75] Inventor: Curtis R. Teel, Jr., Oxford, Pa.

[73] Assignee: Chrysler Corporation, Highland Park

[21] Appl. No.: 104,206

[22] Filed: Aug. 11, 1993

[51] Int. Cl.6 .................. G01R 31/02; G01R 19/14
[52] U.S. Cl. .................. 324/418; 324/556; 324/538; 324/133
[58] Field of Search .............. 324/418, 415, 419, 420, 324/421–423, 449, 133, 503, 555, 556, 537, 538; 340/644, 652; 307/127

[56] References Cited

U.S. PATENT DOCUMENTS

| | | | |
|---|---|---|---|
| 2,432,092 | 12/1947 | Ferrell | 175/183 |
| 2,478,946 | 8/1949 | Rose | 175/183 |
| 3,579,102 | 5/1971 | Keating | 324/418 |
| 4,173,735 | 11/1979 | Merchant | 324/421 |
| 4,686,478 | 8/1987 | Jabs | 324/420 |
| 5,065,101 | 11/1991 | Ledbetter | 324/418 |

FOREIGN PATENT DOCUMENTS

| | | | |
|---|---|---|---|
| 0235762 | 10/1986 | Japan | 324/418 |
| 0237066 | 10/1986 | Japan | 324/418 |
| 0269977 | 11/1990 | Japan | 324/418 |

Primary Examiner—Sandra L. O'Shea
Assistant Examiner—Jay M. Patidar
Attorney, Agent, or Firm—Wendell K. Fredericks

[57] ABSTRACT

A tester for individually testing diode packages, double pole relays and single pole relays includes a circuit contained within a housing, which circuit connects the diode package or relay being tested to a source of 12-volt direct current and transmits the direct current through the diode package, or relay, to an array of indicator lamps under the control of one normally open and two normally closed switches. A forward and reverse bias switch controls the direction of current through the diodes of the diode package and the internal diode of the relays to determine if the diodes and internal diode are oriented properly and conduct current properly.

8 Claims, 3 Drawing Sheets

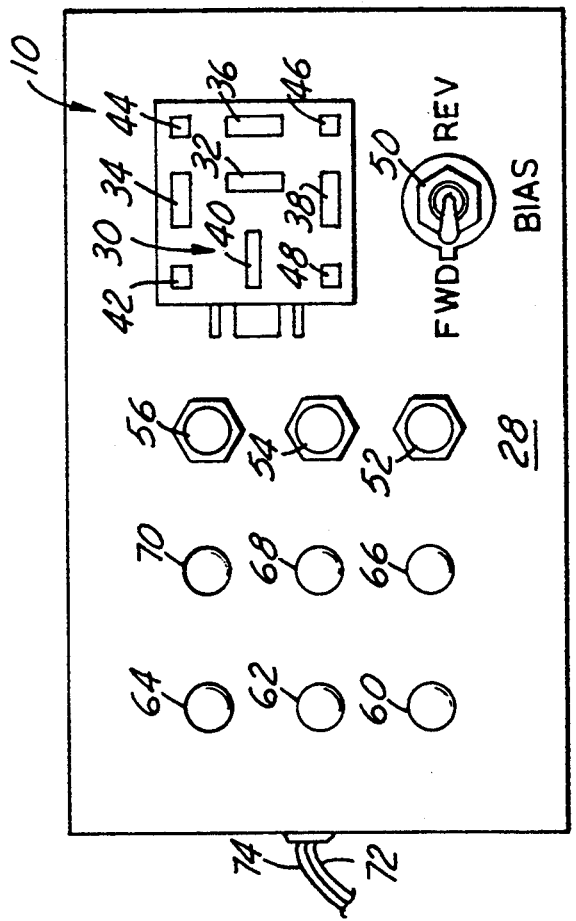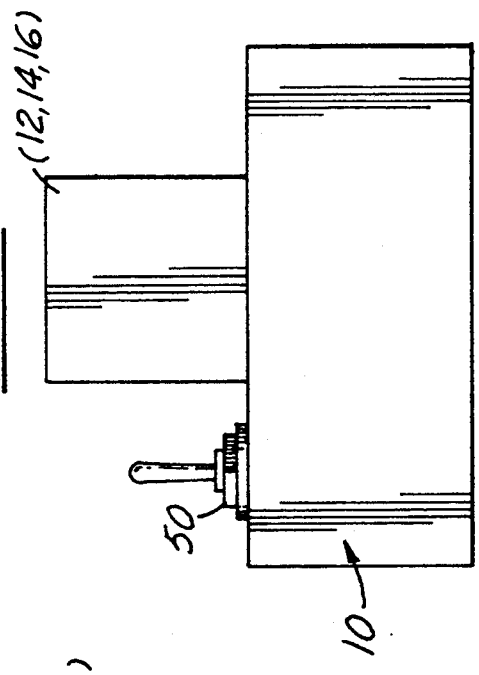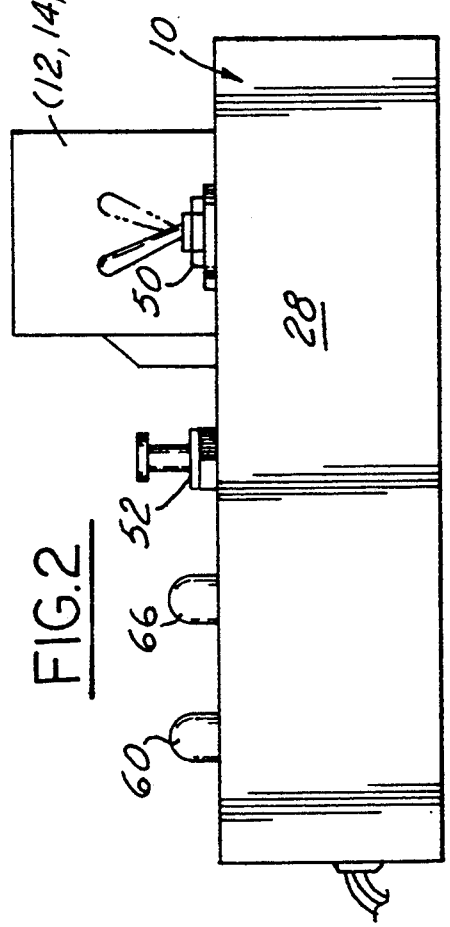

REVERSE/FORWARD BIAS TESTER FOR RELAY AND DIODE PACKAGES

FIELD OF THE INVENTION

The present invention relates to a tester for relays and diode packages. More particularly, the present invention relates to testers for relays and diode packages used for controlling current to electrical components in vehicles.

BACKGROUND ART

Modern automobiles include increasing numbers of relay control circuits having applications and locations which make troubleshooting and diagnostics difficult. With relay blocks left intact, it is impossible to determine if it is the relay or the wiring which is faulty in a circuit which is inoperative. Accordingly, there is a need for a tester technicians can use to verify the operability of existing and replacement relays and diode packages.

Most automobiles include relays of various types, the relays being configured with various pin arrays. Many automobiles now use a rather standard diode package with an array of six internal diodes.

If a relay or diode package malfunctions, operation of one component may cause another component to activate. For example, when a vehicle horn is blown, computers in the vehicle may reset, or perhaps headlamp doors might open or close upon operating a turn signal. These malfunctions may well be due to a diode incorrectly inserted or positioned in a package, to a diode having an internal defect of its own or to a relay which fails to respond. These conditions can be extremely difficult to diagnose and may frequently result in properly functioning parts being replaced without the problem being corrected.

The patent literature includes a number of patents directed to testing relays. Some of these are quite elaborate and expensive. For example, U.S. Pat. No. 4,686,478 discloses a testing device for relays which includes a vibrational mechanism. The arrangement is not particularly suitable for testing relays and diode packages used in the automotive industry wherein relays and having various configurations and diode packages with internal diode circuitries can be tested using the same device. U.S. Pat. No. 2,432,092 discloses an arrangement for testing mechanical relays which have the ability to accept a 4, 6 or 12 position relay and includes a plurality of test lamps and pushbuttons for actuating the tester. However, the relay tester includes a relatively complex arrangement of meters, capacitors and coils which are not necessary for testing modern diode packages or electromechanical automotive relays. U.S. Pat. No. 5,065,101 discloses an apparatus for testing reed-type relays as opposed to diode packages and electromechanical relays. U.S. Pat. No. 4,173,735 discloses a contact fault detector which utilizes a relatively complex circuit for testing contacts used with devices such as alarm circuits. Clearly, the prior art does not include a tester which is of interest with respect to the electromechanical relays and diode packages which are now widely used in the automotive industry.

SUMMARY OF THE INVENTION

It is a feature of the present invention to provide a new and improved tester for testing both electromechanical relays and diode packages.

In accordance with the present invention, a tester tests both relays and diode packages individually. The diode packages include a plurality of diodes while the relays are either double pole relays or single pole relays. The diode package has a first array of pins of a selected orientation and number while the relays have arrays of pins of similar orientation but of different numbers. The tester includes a housing, having a socket area. The socket area has a plurality of socket contacts of a number at least as great as the number of pins projecting from the diode package and of an orientation and spacing to receive the pins of both the diode package and the relays. A first lead connects the tester to a positive source of direct current and a second lead connects the tester to ground. A forward and reverse bias switch is connected to the first and second leads while a normally open switch, a first normally closed switch and a second normally closed switch connect the socket contacts to an array of six indicating lamps. This connection is made with circuitry connecting the forward and reverse bias switch to the input leads to transmit current in the forward and reverse bias directions through the socket contacts and thus through the components of the inserted diode package or inserted relay package. If the current is flowing with a forward bias, the lamps illuminate when the diodes in the package or relay are correctly connected and the lamps extinguish under reverse bias if the diodes are correctly connected. If the lamps do not light or extinguish in accordance with prearranged responses, then the diode package or relay is deemed defective and is disposed of.

BRIEF DESCRIPTION OF THE DRAWINGS

Various other features and attendant advantages of the present invention will be more fully appreciated as the same becomes better understood when considered in conjunction with the accompanying drawings, in which like reference characters designate the same or similar parts throughout the several views, and wherein:

FIG. 1 is a top view of a relay and diode package tester configured in accordance with the principles of the instant invention;

FIG. 2 is a side view of the tester of FIG. 1;

FIG. 3 is an end view of the tester of FIG. 1;

DETAILED DESCRIPTION

Figure 4:
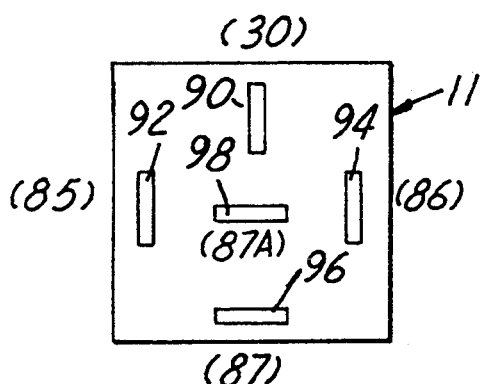
FIG. 4 is a bottom view of an electromechanical double pole relay configured in accordance with the instant invention and having a first array of blade-type contacts.
Figure 5:
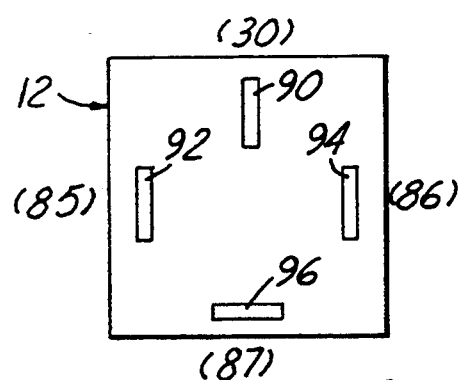
FIG. 5 is a bottom view of a single pole electromechanical relay configured in accordance with the instant invention having a second array of blade-type pin contacts.
Figure 6:
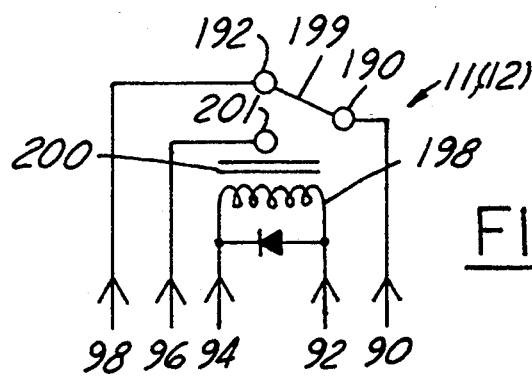
FIG. 6 is a circuit diagram showing the circuit inside of the relays being tested with the tester of the present invention.
Figure 7:
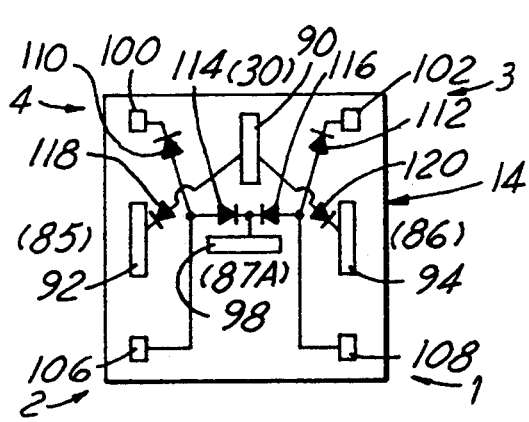
FIG. 7 is a bottom view of a diode package having a third array of blade-type pin contacts.
Figure 8:
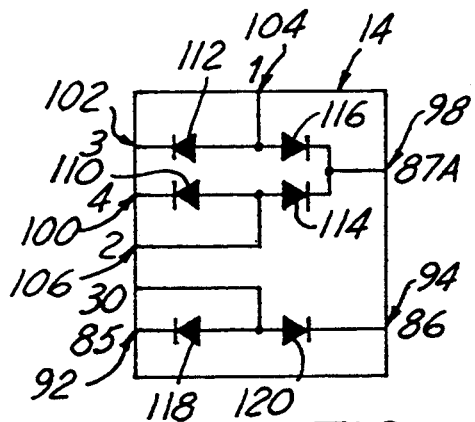
FIG. 8 is a diagrammatical view showing diode circuitry of the diode package of FIG. 6.

FIGS. 1–3 are full size drawings of a relay and diode package tester 10 which operates to prove or disprove the correct operation of various relays and diode packages such as relays 11 and 12 of FIGS. 4, 5 and 6 and the diode package 14 of FIGS. 7 and 8. As is evident from FIGS. 1–3, the small size of the tester 10 renders the tester portable.

The tester 10 performs a complete operational test of the internal electromechanical components of the relays 11 and 12 while the relays are separated from the circuits of the vehicle in which they are used. The tester 10 also checks for the correct positioning and operation of the relay's internal diodes used for suppression. Under normal operating conditions, these characteristics are not readily detectable because the relay is functioning. However, other electrical components in a vehicle's circuitry can fail as a direct result of a diode within the relays 11 or 12 functioning improperly. Simultaneously with testing the electromechanical components and the correct positioning and operation of internal diodes, the tester indicates if the relay being tested is functional, defective or interacting with other electronic components which may be considered defective.

With respect to the diode package 14 of FIGS. 7 and 8, the diode package includes six internal diodes which distribute current to various circuits. The tester 10 detects if any diode is incorrectly inserted or positioned in the package 14. Due to the configuration of diodes within the package 14, the tester 10 identifies any single defect within the sealed cover of the diode package 14.

Due to the heavier circuit needs of relays which draw high current, such as antilock brake system relays (not shown) and larger terminals, the jumper/adapter harness 18 of FIG. 8 is utilized. The jumper/adapter harness 18 allows one to test higher current drawing relays with the same tester 10 designed for use with smaller relays.

The tester 10 provides a quick and accurate apparatus for detecting faulty or suspected faulty components in multiplex circuitry with relay controlled circuits. Wiring and relay banks cannot be properly diagnosed with relays or diode packages mounted in their respective circuits and it is required that the relays and diode packages be removed in order to perform proper diagnostic tests. With the use of the tester 10, defective areas are identified quickly and correctly.

With the foregoing comments in mind, the tester 10 showing in FIGS. 1–3 is a relatively small unit within a housing 28 approximately 4 ½ inches long, 2 ½ inches wide and 1 inch thick. As is seen in FIGS. 4 and 5, the relays 11 and 12 and diode packages 14 being tested are 1 inch cubes with depending pins in the form of blades having various configurations. As is seen in FIG. 1, the components being tested are mounted in a socket area 30 which has an array of female electrical connectors in the form of rectangular, female contact sockets 32, 34, 36, 38 and 40 and square female contact sockets 42, 44, 46 and 48. The sockets 32, 34, 36, 38, 40, 42, 44, 46 and 48 receive pin or blade arrays of various configurations.

The socket area 30 is square in configuration and includes four corners, a first pair of sides and a second pair of sides. The sockets 42, 44, 46 and 48 are square in shape and are disposed proximate the corners of the square area defined by the socket area 30. The sockets 34 and 38 are rectangular and are disposed between the square sockets 42 and 44 and 46 and 48, respectively. The sockets 34 and 38 also extend parallel to adjacent first and second sides of the square defined by the area 30. The socket 40 is also rectangular and is adjacent a third side of the square while extending parallel to the sockets 34 and 38 and being disposed between the square sockets 42 and 48. The socket 36 is also rectangular and is disposed adjacent the fourth side of the square defined by the area 30. The rectangular socket 36 is perpendicular to the rectangular sockets 34, 38 and 40, Finally, the rectangular socket 32 is disposed proximate the center of the square defined by area 30 and extends parallel to the rectangular socket 36.

Disposed proximate the socket area 30 is a forward and reverse bias switch 50 and disposed in front of the forward and reverse bias switch and socket array 30 are a first normally closed pushbutton switch 52, a second normally closed pushbutton switch 54 and a third pushbutton switch 56 which is normally open. The switches 52, 54 and 56 connect the socket contacts 32, 34, 36, 38, 40, 42, 44, 46, 48 to an array of lamps 60, 62, 64, 66, 68 and 70 (hereinafter 60–70). Tester 10 is connected by a pair of lines 72 and 74 to a 12 volt power supply which may be, for example, a 12-volt vehicle battery.

Referring now to FIGS. 4 and 6, where the double pole, single throw relay 11 is shown, it is seen that each pin of the relay has standardized numbers shown in brackets. For purposes of this specification, each pin also has a reference numeral. In the relay 11, pin 90 is the #30 load input pin; pin 92 is the #85 coil B− pin; pin 94 is the #86 coil B+ pin; pin 96 is the #87 switched load output pin; and pin 98 is the #87A static load output pin. Examples of the double pole relays 11 which are tested by the tester 10 are: model numbers PN 4671001, Pokorney Industries; 4671049, Bosch; 4373229, Elbi/Hi-Ram; 4687148, Hella Electronics; 4687144, Elbi/Hi-Ram; and 5266147, Hella Electronics.

Referring now to FIGS. 5 and 6, where the single pole relay, single throw 12 is shown, the single pole relay has the same pin configuration as the double pole relay with the exception that pin 98 for the #87A static load output pin is deleted. Examples of the single pole relays 12 are: model numbers PN 4557132, Elbi/Hi-Ram; 4557137, Elbi/Hi-Ram; 4557656, Elbi/Hi-Ram; 5233018, Hella Electronics; 5233210, Hella Electronics; 5233207, Hella Electronics; 5234506, Pokorney Industries; and 4687143, Hella Electronics.

Referring to FIGS. 7 and 8, it is seen that the array of pins for the diode package 14 is different from that of the relays 11 and 12 of FIGS. 4 and 5. The pins 90, 94, 92 and 98 remain; however, the pin 96 has been deleted and square, cross-section pins 100 (#4), 102 (#3); 104 (#1); and 106 (#2) have been added. Pins 100, 102, 104 and 106 connect with six diodes 110, 112, 114, 116, 118 and 120. How the diodes are connected in the array are perhaps better seen diagrammatically in FIG. 7. The diode package 14 may be model number 4373745 from Dualtec Electronics.

Figure 9:
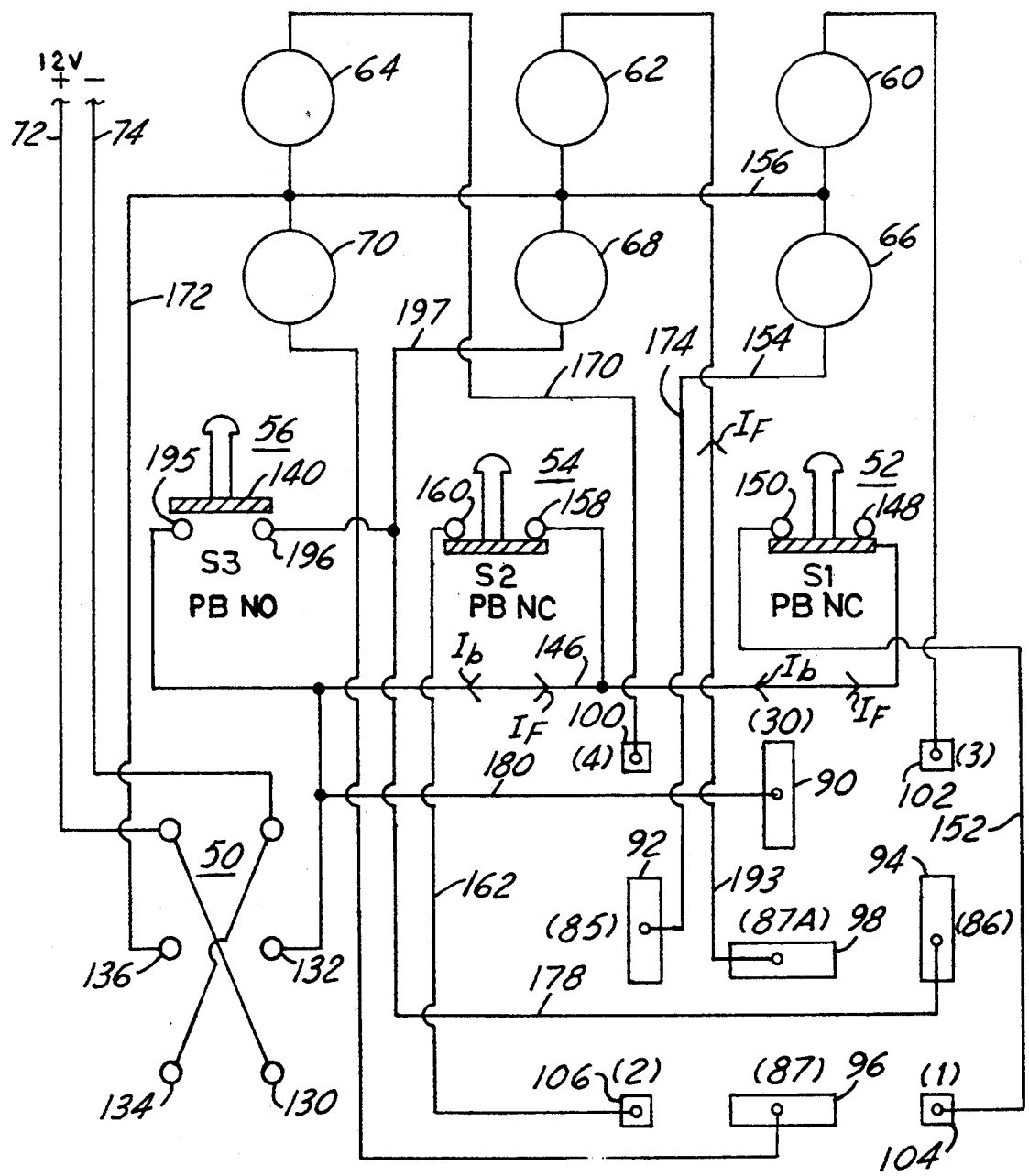
FIG. 9 is a circuit diagram showing the testing circuitry within the testing module of FIGS. 1-3.

Referring now to FIG. 9 where a circuit diagram of the circuitry within tester 10 is shown, it is seen that the tester leads 72 and 74 are connected to the positive and negative terminals of a 12-volt battery or other 12-volt power source and the relay 11 or 12 or the diode package 14 to be tested, is plugged into the socket receptacle 30. The bias switch 50 is moved to the forward bias positioned in which contact 130 is connected to contact 132 and contact 134 is connected to contact 136. Normally open pushbutton switch 56 is then closed. This will cause lamp 68 to light indicating that current is flowing to the unit from the 12-volt source to ground via leads 72 and 74. The lamp 68 will illuminate if the bias switch 50 is in either the forward or reverse bias mode. The lamp 68 will illuminate any time power is applied and the normally-open switch 56 is depressed.

To begin the test of a suspected diode package 14 (FIGS. 7 and 8), the diode package 14 is mounted in the socket area 30 of the tester 10 with the bias switch 50 in the forward position. Lamps 60, 62, 64, 66 and 68 should illuminate. If one of the lamps 60, 62, 64, 66, 68 does not light, it is known that the diode package 14 has an open diode circuit, is defective, and should be replaced. The lamps 60, 62, 64, 66, 68 are each illuminated because the current $I_f$ is flowing in the forward direction with respect to the diodes 110–120 over the lines connecting each of the diodes to the lamps 60–68. The pushbutton switches 52 and 54 are normally closed as opposed to the pushbutton switch 56 which is normally open, allowing the current to flow in the direction indicated by arrows $I_f$.

Considering the test more specifically, when a diode package 14 is placed in the tester 10, the lamps 60–68 illuminate in the forward bias mode. Lamp 60 indicates that the internal diode 112 (FIGS. 7 and 8) is good. When testing the internal diode 112, current flows from the switch pin 132 in via switch 50, over the line 146 to the pin 148 in normally closed switch 52. The current then flows out of pin 150 to the tester pin 104 over line 152 to the tester pin 104 (see FIGS. 7 and 8) in the diode package 14. The current then continues to pass through the diode 112 in the diode package 14 and out of the test pin 102 to the lamp 60 over line 154. Lamp 60 passes current over line 156 to the pin 136 of the bias switch 50 which is toggled through ground pin 134, and to ground or the negative terminal of the battery via line 74. When the normally closed switch 52 is pressed to open contact, the lamp 60 should extinguish if the diode 112 in the diode package 14 is good. If the lamp 60 does not extinguish, then the diode package 14 has an internal failure or short.

When the lamp 62 is lit, the lamp indicates that internal diodes 114 and/or 116 (FIGS. 7 and 8) are good. During the test, current flows from the switch pin 132 over line 146 to normally closed switches 52 and 54 via pins 148 and 158, respectively. From switch pin 150 in normally closed switch 52 and switch pin 160 in normally closed switch 54 current flows to the tester pins 104 and 106 via lines 162 and 152, respectively. The current then passes through internal diodes 116 and 114 (FIGS. 7 and 8) to the tester pin 98. When the switch 52 is depressed, only lamp 60 should extinguish. If lamp 62 also extinguishes, then the diode 116 (FIGS. 7 and 8) is faulty. When switch 52 is released and switch 54 is depressed, only lamp 64 should extinguish. If lamp 62 extinguishes, then the diode 114 is faulty. When switches 52 and 54 are depressed simultaneously, lamps 60, 62 and 64 should all extinguish. If lamp 62 remains illuminated, then there is a failure of an internal diode in the package 14.

Lamp 64 indicates that the internal diode 110 (FIGS. 7 and 8) is good. Lamp 64 is operated by current which flows from the negative switch pin 32 and the bias switch 50 to the pin 158 in normally closed pushbutton switch 54 and from pin 160 in normally closed pushbutton 54 to the tester pin 106. From the tester pin 106, current flows through the diode 110 to the pin 100.

Since pin 100 is connected to the lamp 64 by line 170 and the lamp 64 is connected via line 172 to the ground pin 136 in the bias switch 50, lamp 64 only extinguishes when the switch 54 is depressed. If lamp 64 does not extinguish, the diode package 14 has an internal failure or short.

Lamp 66 indicates whether or not the diode 118 in the diode package 14 is good. Current flows from the positive pin 132 in the bias switch 50 to the tester pin 90 and through the internal diode 118 (FIGS. 7 and 8) to the tester pin 92. The tester pin 92 is connected by line 174 to lamp 66 and lamp 66 is connected to ground through the pin 136 in the bias switch 50. If the lamp 66 does not illuminate, the diode 118 is faulty. There is no need to depress switches 52 or 54 to test the diode 118.

Lamp 68 indicates whether or not the internal diode 120 (FIGS. 7 and 8) in the diode package 14 is good. Current flows from the positive pin 132 in the bias switch 50 to the tester pin 90 and then through the internal diode 120 to the tester pin 94. From the tester pin 94, current flows over line 178 through the lamp 68 and back to the negative or ground pin 136 in the switch 50. If the lamp 78 does not illuminate, the diode 120 is faulty. As with the lamp 66 and the diode 118, there is no need to depress either of the normally closed switches 52 or 54 to test the diode 120.

With the lamps 60, 62, 64, 66, 68 illuminated, the switch 52 is depressed, opening contacts 150 and 148. Upon depressing the switch 52, only lamp 60 should extinguish. If switch 52 is released and switch 54 is depressed, opening contacts 168 and 158, only lamp 64 should extinguish. The diode pack 14 is functioning properly if lamps 60 and 64 extinguish while lamp 62 remains illuminated. Finally, if switches 52 and 54 are pressed so as to be opened simultaneously, then lamp 62 should extinguish together with lamps 60 and 64.

The purpose of opening normally closed switch 52 is to test for operation of diode 114 and the purpose of opening normally closed switch 54 is to test diode 116. Both switches 52 and 54 are used to test for internal shorts within the diode package 14.

The final test is to reverse the bias by operating the switch 50 to connect contact 130 with contact 136 and contact 134 with contact 132. All of the lamps 60, 62, 65, 66 should then extinguish. If none of the lamps 60, 62, 65, 66 illuminate, the diode package 14 is operational; however, if any one of the lamps remains lit, then at least one of the diodes 110, 112, 114, 116, 118 and 120 is for one reason or another conducting current in the wrong direction and the diode package 14 should be disposed of.

Each of the lamps 60, 62, 65, 66, 68 is connected in series with the diodes 110 and 120 so that if the forward bias current is being conducted properly through the diodes, the lamps will receive current. If at least one of the diodes 110–120 is not functioning, then at least one of the lamps 60, 62, 64, 66 will not illuminate. Upon reversing the current so that the current flows in the direction $I_b$, there is backward resistance by the diodes 110–120 and no current flows so that the lamps 60, 62, 64, 66 are not lit in the diode package is functioning properly.

If the component being tested by the tester 10 is a double pole relay such as the relay 11 (FIG. 4), the relay provides a feed before and after being activated but to different circuits. The test is conducted by inserting the relay 11 in the socket area 30 and observing the lamp 62. The lamp 62 should illuminate without pressing any of the buttons 52, 54 and 56. If the lamp 62 does not light, then the relay should be checked to make sure that there are five terminals indicating that the relay is a double pole, single terminal relay shown in FIGS. 4 and 6. If lamp 62 does not light after replacing the relay 11 on the connector, then it can be assumed that the relay 11 is defective.

Considering the test of the double pole, single throw relay 11 of FIGS. 4 and 6 in greater detail, when the lamp 62 is illuminated, the contacts 130 and 132 are providing continuity. Lamp 62 should illuminate as soon as the relay 11 is placed in the powered tester 10. Current from the pin 132 and the bias switch 50 close to the tester pin 90 over line 180 and inside the relay current flows through pin 190 through line 199 to pin 192 that is connected to the tester pin 98. The tester pin 98 is connected in series with lamp 62 by line 193 and is also in series with negative or ground pin 134 through pin 136 in the bias switch 50 via line 172.

When the normally open switch 56 is pressed, current is supplied to the tester pin 90 and the pin 195 in switch 56. Current then flows out of pin 196 to line 197 so as to flow through tester pin 94 which applies current to the electromagnetic coil 198 within the relay 11. The coil is energized through pin 92 which is in series with lamp 66 and with the ground pin 136 it is connected by pin 134 in bias switch 50 to the ground or negative line 74. When energized, the lamp 66 may illuminate dimly since it is receiving a low voltage. Contact normally connected between pins 190 and 192 in the relay 11 is attracted by the electromagnet 200 into contact with the pin 201. This causes power to be removed from the contact 192 which extinguishes a lamp 62 and sends power to the lamp 70 via the pin 96.

If the relay 11 passes the first test, then the switch 56 should be pressed and lamps 68 and 70 should illuminate which indicates that current is being transmitted through the relay 12. In addition, a clicking sound indicating operation of the relay within the relay housing 12 should occur. If the lamp 70 does not light, then this indicates that the secondary pole of the relay within the relay package 12 is defective. The operator should keep in mind that any time the switch 56 is pressed, the lamp 68 should illuminate, indicating a tester 10 is receiving power over leads 72 and 74 connected to the 12-volt power supply.

To continue the test, bias switch 50 is then placed in the reverse position, connecting terminal 130 to terminal 136 and terminal 134 to terminal 132. Upon pressing a normally open pushbutton switch 56, the lamps 62, 66 and 68 should illuminate. If the relay 11 activates and lamps 68 and 70 illuminate, which is the case when the bias switch 50 is in the forward mode connecting terminals 130 and 132 and 134 and 136, the internal diode of the relay 11 is open, the relay is defective and should be disposed of.

It should be kept in mind that some relays 11 do not use diode protection such as that provided by the internal safety diode 202 but rather use resistance. When resistance is used, the coils 198 will produce electromagnetism and the relay 11 will function as if the bias switch 50 of the tester 10 is in a forward bias. Relays 10 which utilize a resistance rather than diode the internal safety 202 usually indicate which type of suppression is being used.

When the relay being tested is a single pole (SPST) relay 12 (FIG. 5) of a type which provides a feed only after activating, none of the lamps 60, 62, 64, 66, 68, 70 should illuminate upon inserting the relay into the tester 10. However, if the relay is a double pole, single terminal relay being used as a SPST, the lamp 62 may illuminate. When the normally open pushbutton switch 56 is depressed to connect terminals 195 and 196, lamps 68 and 70 should illuminate and the relay 12 should click, if operating properly. If lamp 70 does not illuminate, the relay 12 is defective and should be disposed of.

For a final test, a reverse bias is selected by the bias switch 50, connecting contacts 130 and 136 and contacts 134 and 132. Normally open pushbutton switch 56 is then pressed. Only lamps 66 and 68 should illuminate. If the relay clicks or lamp 70 illuminates, the relay has an open internal diode indicating that the relay is defective and should be disposed of.

The single pole, single throw relay 12 of FIG. 5 functions when tested exactly the same as the single pole, double throw relay with the exception that there is no contact 192 in the relay and therefore the lamp 62 does not illuminate.

Figure 10:
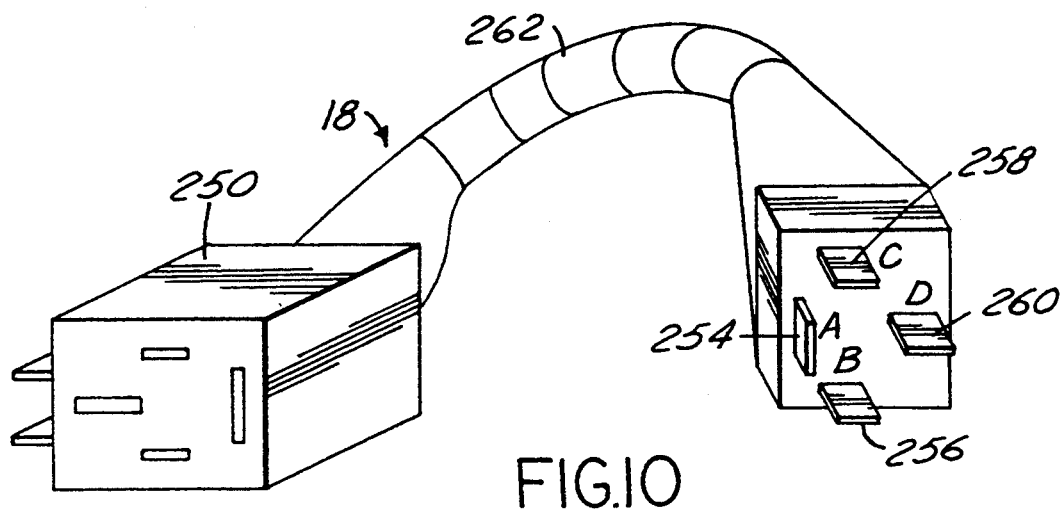
FIG. 10 is a perspective view of a jumper used as an adapter for relays which have larger terminals.

Referring now to FIG. 10 where the jumper/adaptor 18 is shown, it is seen that the jumper/adaptor has a female terminal connector 250 for receiving the pins of a large relay (not shown) and a male terminal 252 which has pins 254, 256, 258 and 260 for insertion into the contact sockets 90, 92, 94 and 96 of the socket area 30 of the tester 10 (see FIG. 1). The adapter is used for electrically connecting relays and diode packages having pins of a different size and spacing to the tester. The female terminal 250 and male terminal 252 are connected by a cable 262.

During all of the aforedescribed test procedures, the lamps 60, 62, 64, 66, 68, 70 should illuminate at their intended normally intensity. With the single exception of lamp 66 illuminating dimly when testing the coil 198 in the relays 11 and 12, if one or more of the lamps fails to illuminate to the intended intensity, it can be assumed that current is not being conducted at design levels through the relay or diode package being tested.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A tester for testing individually diode packages which include pluralities of diodes, double pole relays and single pole relays with each relay including a safety diode connected across a coil within the relay, the diode packages being tested, each having a first array of pins of a selected orientation and selected number, and the relays being tested, each having other arrays of pins of similar orientation but different numbers, the testing apparatus comprising:

a housing, the housing having a socket area thereon, the socket area including a plurality of socket contacts of a number at least as great as the number of pins projecting from the diode packages; the socket contacts being of a size, orientation and spacing to receive the pins of one of the diode packages, one of the single pole relays or one of the double pole relays;

a first lead for connecting the tester to a positive source of direct current and a second lead for connecting the tester to ground;

a forward and reverse bias switch connected to the first and second leads;

a normally open switch;
a first normally closed switch;
a second normally closed switch;
an array of indicating lamps;
circuitry connecting the indicating lamps to the socket contacts through the normally open and normally closed switches, the circuitry being connected by the forward and reverse bias switch to the input leads to transmit current in the forward and reverse bias direction through the socket contacts and thus through the components of the inserted diode package or inserted relay, the current being transmitted by the circuity through the normally closed switches and through the array of lamps, whereby, if the current is flowing with a forward bias, the lamps illuminate if the diode within the diode package or the diode in the relay being tested are correctly connected and wherein the lamps extinguish under reverse bias if said diodes are incorrectly connected, the circuitry also including an indicating lamp connected across the socket contacts, the two socket contacts being arranged to receive contacts of the relay being tested which are connected to poles in the relay, which poles are electrically connected upon energizing the relay wherein the indicating lamp illuminates if the relay as a whole is functioning properly; and, whereby, the internal components of the relay including said safety diode being individually tested by controlling said normally open switch and said first and second normally closed switches.

2. The tester of claim 1, wherein there are nine socket contacts arrayed to receive five pins extending from the double pole relay, four pins extending from the single pole relay or eight pins extending from the diode package.

3. The tester of claim 1, wherein each lamp has one contact connected by leads of the circuitry to ground and the other contact connected by leads of the circuitry to at least two socket contacts wherein all the lamps illuminate and extinguish to indicate proper functioning of the diode package as a whole under forward bias and reverse bias, respectively, and individual lamps illuminate and extinguish to test individual diodes within the diode package to unmask defective diodes hidden by interconnection with other diodes within the diode package.

4. The tester of claim 3, wherein there are six lamps in the tester and six diodes within the diode package.

5. The tester of claim 4, wherein in the socket area of the housing has nine socket contacts each connected by the circuitry to at least two lamps, the socket contacts of the tester being electrically connected to one another by internal diodes within the diode package when a diode package is being tested and by internal relay and diode components when a relay is being tested.

6. The tester of claim 1, wherein the tester is of a size which renders the tester portable.

7. The tester of claim 1 further including an adapter for electrically connecting relays and diode packages having pins of a different size and spacing to the tester.

8. The tester of claim 1, wherein there are nine socket contacts arrangement in a square array with a square having four corners and first and second sets of parallel sides, the nine socket contacts including four relatively small square socket contacts disposed proximate the corners of the square, first and second rectangular socket contacts disposed between two square contacts proximate opposite sides :of the square and extending parallel thereto; a third rectangular contact extending perpendicular to one side of the second pair of sides and parallel to the first and second rectangular contacts; a fourth rectangular contact extending parallel to the other side of the second set of sides and perpendicular to the first and second rectangular contacts; and a fifth rectangular contact located proximate the center of the square and extending parallel with respect to the fourth contact, whereby the socket contacts receive the contacts of either the diode package, the single pole relay or the double pole relay which have eight, four and five contacts each, respectively.

* * * * *